United States Patent
Patino

(10) Patent No.: US 7,098,666 B2
(45) Date of Patent: Aug. 29, 2006

(54) METHOD AND SYSTEM FOR BATTERY STATE OF CHARGE ESTIMATION BY USING MEASURED CHANGES IN VOLTAGE

(75) Inventor: Joseph Patino, Pembroke Pines, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/900,600

(22) Filed: Jul. 28, 2004

(65) Prior Publication Data
US 2006/0022677 A1     Feb. 2, 2006

(51) Int. Cl.
*G01N 27/416*     (2006.01)

(52) U.S. Cl. ........................... 324/433; 320/151

(58) Field of Classification Search ............. 324/430, 324/431, 433, 429; 320/152, 153, 151, 156
See application file for complete search history.

(56) References Cited

U.S. PATENT DOCUMENTS

| | | | | |
|---|---|---|---|---|
| 5,012,176 A | * | 4/1991 | LaForge | 320/152 |
| 5,642,031 A | * | 6/1997 | Brotto | 320/156 |
| 5,973,499 A | * | 10/1999 | Schulmann | 324/503 |
| 6,359,419 B1 | | 3/2002 | Verbrugge et al. | |
| 6,529,840 B1 | * | 3/2003 | Hing | 702/63 |
| 6,661,231 B1 | * | 12/2003 | Arai et al. | 324/426 |
| 2002/0075003 A1 | * | 6/2002 | Fridman et al. | 324/426 |

* cited by examiner

*Primary Examiner*—Adolf Deneke Benhane
*Assistant Examiner*—Aaron Piggush

(57) ABSTRACT

A method (20 or 30) and system (40) for estimating a battery state of charge can include a memory (48) for storing at least one among an impedance value, a plurality of values for V drop 0-1, or a plurality of values for V drop 0-1 normalized for charge or discharge values providing a stored plurality of values. The system can include a processor (44) and can measure at least one among V drop C-0 providing a measured V drop C-0 value and V drop 0-1 for the providing a measured V drop 0-1 value. The processor can be programmed to perform the functions of dividing the V drop C-0 value by the impedance value to estimate a charging current at the battery or comparing the measured V drop 0-1 value with a value among the stored plurality of values to estimate the battery state of charge.

17 Claims, 2 Drawing Sheets

MODEL OF BATTERY

METHOD AND SYSTEM FOR BATTERY STATE OF CHARGE ESTIMATION BY USING MEASURED CHANGES IN VOLTAGE

FIELD OF THE INVENTION

This invention relates generally to battery charging, and more particularly to a method and system of estimating a battery state of charge.

BACKGROUND OF THE INVENTION

A battery state of charge is routinely displayed to the user for numerous types of products. There are many examples of inaccuracies causing incorrect displaying of the state of charge. For example, with Nickel Metal Hydride (NiMH) batteries, it is difficult to predict their state of charge (SOC) because of the charging and discharging characteristics of NiMH battery technology. It can be shown on charge and discharge curves that while voltages can be the same, the SOC can be substantially different. Thus, it is very difficult to use an open circuit voltage to accurately predict the SOC of the NiMH battery, as the battery operating mode (charging, discharging, or charge sustaining) should be known. Other battery technologies have similar issues creating a difficult environment for accurately estimating the state of charge for any particular battery technology. There fails to exist an accurate means of estimating the state of charge without necessarily increasing the cost of an overall system.

In some SOC measuring schemes, a sense resistor is used to measure the current flowing into or out of a battery. The sense resistor value depends on the currents being measured. In general, a sense resistor should be selected so that the voltage drop across that resistor exceeds a predetermined voltage for the lowest current representing the majority of the battery drain, and the lowest practical voltage drop across the sense resistor is achieved to maximize the useful voltage available from the battery pack.

U.S. Pat. No. 6,359,419 by Verbrugge et. al. discusses a method of determining a state of charge of a battery by determining a "current-based" state of charge measurement based on coulomb integration, determining a voltage-based state of charge measurement based on the resistance of the battery and a hysteresis voltage, and combining the current-based state of charge measurement and the voltage-based state of charge measurement with a weighting factor to generate the state of charge of the battery. Even if such a system were accurate, it appears to be quite computatively complex and expensive. Furthermore, such a system may not work well for an induction charging system where there is no physical connection between the battery and the charging apparatus or device.

Induction charging systems are well known in the field of portable electrical devices. For example, portable motorized toothbrushes typically contain a rechargeable battery which is charged by induction. Similarly, portable wireless communication devices, such as two-way radio frequency (RF) radios, cellular phones, paging devices, and wireless communicators, commonly utilize a rechargeable battery that, in certain applications, is recharged by contactless induction charging. Such portable devices are becoming increasingly popular because of the convenience afforded a user by working without a wired connection, such as not having to connect plugs to sockets, not having to precisely locate and plug a unit to be charged, and the ability to quickly remove from a charger unit a device that has been recharged ("grab-n-go").

Unfortunately, present induction charging systems either have little control over input voltage to the charge control circuitry, or such systems employ wireless techniques to control these parameters by regulating the base of the charging system. Notably, implementation of wireless control techniques within the charging system is expensive. Accurately estimating the SOC of a battery being charged and utilizing such information would allow for a more efficient charging system.

SUMMARY OF THE INVENTION

Embodiments in accordance with the present invention utilize a measurement of voltage drop to estimate a battery charge current and an electronic device's use of this estimate to further estimate the state of charge of the battery. In this regard, specific voltage drops can be defined to further clarify certain embodiments of the present invention. First, "V drop C-0" refers to the battery voltage delta (V drop) at the moment that a charge current that was being applied to a battery (C) is removed from the battery (0). Secondly, "V drop 0-1" refers to the battery voltage delta (V drop) from the moment that the charge current is removed from the battery (0) to some duration of time thereafter (1).

In a first embodiment of the present invention, a method of estimating a battery state of charge includes the steps of measuring a battery voltage when a charger is on, measuring a battery voltage when the charger is subsequently turned off, calculating a difference between the battery voltage when the charger is on and when the charger is subsequently turned off, and dividing the difference by an impedance value stored in a memory to estimate a current that the battery is being charged at. The impedance value can be stored in an EPROM for example. The difference in battery voltage can be calculated at the moment between when a charge current was being applied and when the charge current is removed from the battery. The method can further include the step of updating a charge indicator such as a fuel bar on an electronic device using the current that has been estimated. The method can also include the step of storing a plurality of values that are an ohmic measurement proportional to R1C1 in a battery cell model represented as 2 sets of series RC elements in parallel. Note, the plurality of values can be temperature compensated.

In a second embodiment of the present invention, another method of estimating a battery state of charge in an electronic device can include the steps of storing at least one among a plurality of values for V drop 0-1 for a given battery and a plurality of values for V drop 0-1 for the given battery normalized for charge or discharge values providing a stored plurality of values, measuring V drop 0-1 for the given battery providing a measured V drop 0-1 value, and comparing the measured V drop 0-1 value with at least one value among the stored plurality of values to estimate the battery state of charge. The step of comparing can be done in either a charge mode or a discharge mode. Measuring V drop 0-1 can involve measuring a voltage drop associated with R2C2 and a normalized voltage drop to charge/discharge currents in a battery cell model represented as 2 sets of series RC elements in parallel. Note, the method can further include the step of temperature compensating the stored plurality of values.

In a third embodiment of the present invention, a system for estimating a battery state of charge can include a memory such as an EPROM for storing at least one among an impedance value, a plurality of values for V drop 0-1 and a plurality of values for V drop 0-1 for a given battery normalized for charge or discharge values providing a stored plurality of values. The system can further include a measuring device measuring at least one among V drop C-0 for the given battery providing a measured V drop C-0 value and V drop 0-1 for the given battery providing a measured V drop 0-1 value as well as a processor. The processor can be programmed to perform at least one among the functions of dividing the V drop C-0 value by the impedance value to estimate a current that the battery is being charged at or comparing the measured V drop 0-1 value with at least value among stored plurality of values to estimate the battery state of charge. Note, V drop C-0 comprises a difference between a battery voltage when a charger is on and when the charger is turned off and V drop 0-1 refers to the battery voltage delta (V drop) from the moment that the charge current is removed from the battery (0) to some duration of time thereafter (1). Further note that one or more among the memory, the measuring device and the processor can reside at least one among a battery and an electronic device such as a cellular phone, a shaver, a charging device, a two-way radio, a cordless telephone, a cordless toothbrush, a cordless hand tool, and a wireless or cordless charging device.

Other embodiments, when configured in accordance with the inventive arrangements disclosed herein, can include a system for performing and a machine readable storage for causing a machine to perform the various processes and methods disclosed herein.

DETAILED DESCRIPTION OF THE DRAWINGS

Figure 1:
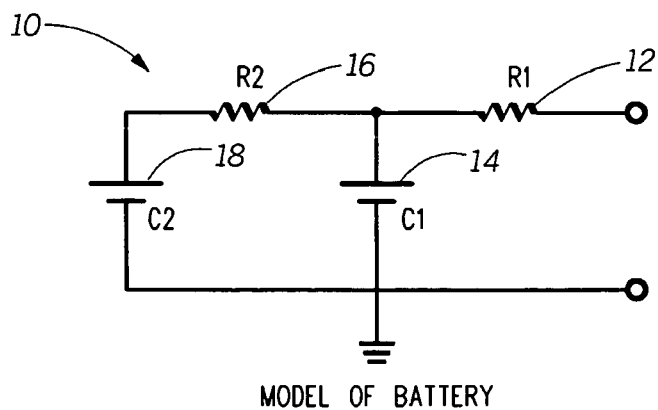
FIG. 1 is an illustration of model of a battery in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Several embodiments of the present invention allows an external device such as a radio unaware of the amount of current going to the battery (such as in the case of a battery being charged by some external device i.e. a wireless charger incorporated directly into the battery) to estimate the state of charge of the battery. Note, though, that the present invention is not necessarily limited to wireless or induction charging systems.

In one embodiment of the present invention, a system measures the voltage drop (V drop C-0) between charge current on and charge current off and divides that value with a stored R1 impedance value stored in a battery's memory (such as an EPROM), to estimate the amount of current that the battery is being charged at. Based on that charge current estimation, an electronic device (such as a radio) can now determine when the battery has reached the current threshold associated with the fuel bar information stored the battery's memory.

Referring to block diagram of battery cell model in FIG. 1, a battery 10 is represented as 2 sets of series RC elements in parallel. The series RC elements can include a first pair of series elements resistor R1 (12) and capacitor C1 (14) and a second pair of series elements resistor R2 (16) and capacitor C2 (18). The ohmic measurement proportional to R1C1 is substantially constant. Therefore this information can be stored in the battery memory (such as the EPROM) for later use. It can further be temperature compensated if so desired for further improved accuracy.

Since the impedance R1 is now known from the EPROM information, by measuring the V drop of C-0 and dividing it by R1, an estimate of the charge current can be made. Accordingly, the electronic product (such as the radio) can now read the battery voltage and estimate the charge current. It therefore can use this information to compare to the standard fuel bar information stored in the battery EPROM to determine the battery's present state of charge in charge mode.

In this fashion, a radio that does not know the charge current to the battery (such as is the case for a battery that has wireless charge circuitry embedded directly in the battery) can now estimate the state of charge of the battery in charge mode.

Additionally, the V drop C-0 relationship in discharge also holds true. A chart illustrating discharge data and charging data can shown that the measured impedance value is consistent for both charge and discharge modes and therefore can also be used to determine a load current being placed on the battery by measuring the V drop C-0 and dividing it by the stored impedance value.

In summary, embodiments in accordance with one aspect of the invention measures the voltage drop associated with R1C1 to estimate the battery charge current and the electronic product (in this example, the radio) can then use this information to estimate the state of charge of the battery.

In an alternative embodiment, the effect of R1 ohmic loss (V drop C-0) can be ignored and the battery's R2C2 (V drop 0-1) affect is used instead to estimate capacity. The V drop 0-1 effect can be used to estimate the state of charge of the battery for both charge and discharge mode.

Referring once again to FIG. 1, as previously noted, the ohmic measurement proportional to R1 (V drop C-0) is substantially constant. V drop 0-1 is a function of both R2 and C2, and can not be attributed solely to either element. During charging, V drop 0-1 tracks charge current. However, if V drop 0-1 is normalized for the charge current, the battery's state of charge increases as the time constant created by R2C2 decreases so that the corresponding V drop increases. Therefore, V drop 0-1 normalized for charge current can be used as indication of the battery's state of charge.

Discharge data would show that as the state of charge decreases, the time constant created by R2C2 also decreases. This causes the rate of V drop 0-1 and V drop 0-1 normalized for the discharge current to both increase. Hence they can be used to estimate the battery's state of charge.

So by storing typical V drop 0-1 and V drop 0-1 values normalized for charge/discharge current values in the battery's memory (such as in an EPROM), one can measure the V drop 0-1 value associated for a given battery and compare it to the stored values to estimate the battery's state of charge. These values can be further temperature compensated to allow for better resolution in the estimate.

Therefore V drop 0-1 and V drop 0-1 normalized for charge or discharge current track the state of charge of the battery for both charge and discharge modes. Accordingly, this can now be used to estimate the state of charge of the battery in either charge or discharge mode. The measurement of the voltage drop associated with R2C2 and their normalization to charge/discharge currents now allows an electronic product like a radio to use this information to estimate the state of charge of the battery.

Figure 2:
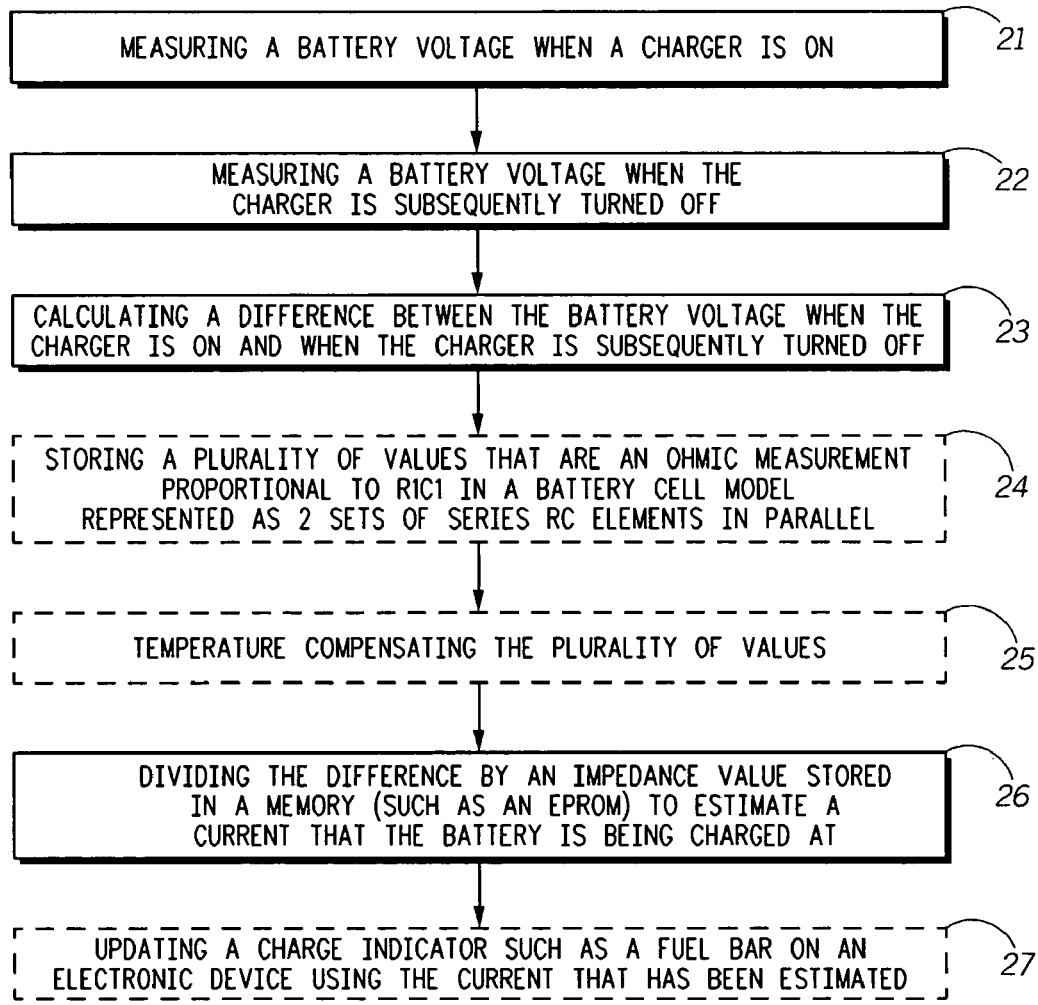
FIG. 2 is a flow chart illustrating a method of estimating a battery state of charge in accordance with an embodiment of the present invention.

Referring to FIG. 2, a method 20 of estimating a battery state of charge can include the steps of measuring a battery voltage when a charger is on at step 21, measuring a battery voltage when the charger is subsequently turned off at step 22, and calculating a difference between the battery voltage when the charger is on and when the charger is subsequently turned off at step 23. Optionally, the method further includes the step of storing a plurality of values at step 24 that are an ohmic measurement proportional to R1C1 in a battery cell model represented as 2 sets of series RC elements in parallel. Optionally, as indicated at step 25, such plurality of values can be temperature compensated. The method 20 can further include the step 26 of dividing the difference by an impedance value stored in a memory (such as an EPROM) to estimate a current that the battery is being charged at. Optionally, at step 27, a charge indicator such as a fuel bar can be updated on an electronic device using the current that has been estimated.

Figure 3:
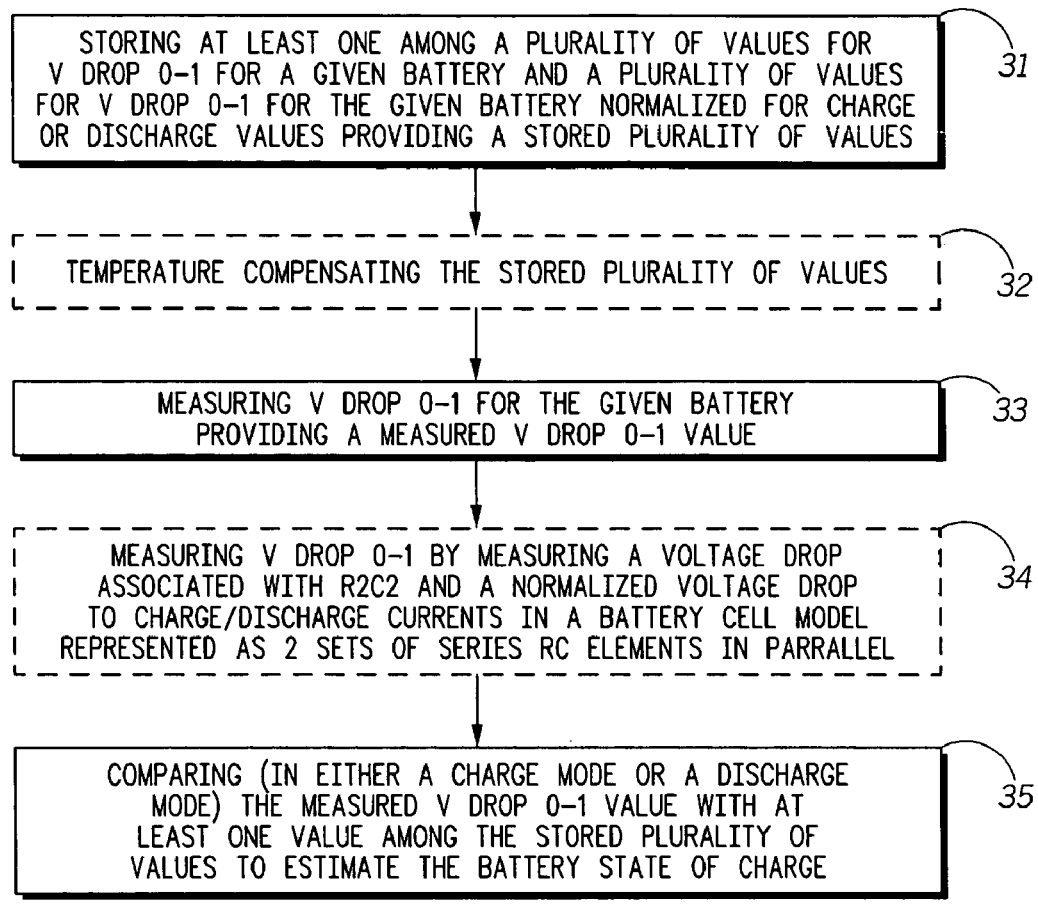
FIG. 3 is a flow chart illustrating another method of estimating a battery state of charge in accordance with an embodiment of the present invention

In an alternative method as illustrated in FIG. 3, a method 30 of estimating a battery state of charge in an electronic device can include the steps of storing at least one among a plurality of values for V drop 0-1 for a given battery and a plurality of values for V drop 0-1 for the given battery normalized for charge or discharge values providing a stored plurality of values at step 31 and optionally temperature compensating at step 32 the stored plurality of values. The method 30 can further include the step 33 of measuring V drop 0-1 for the given battery providing a measured V drop 0-1 value. As shown in step 34, measuring V drop 0-1 can be done by measuring a voltage drop associated with R2C2 and a normalized voltage drop to charge/discharge currents in a battery cell model represented as 2 sets of series RC elements in parallel. The method 30 can then compare (in either a charge mode or a discharge mode) the measured V drop 0-1 value with at least one value among the stored plurality of values to estimate the battery state of charge at step 35.

Figure 4:
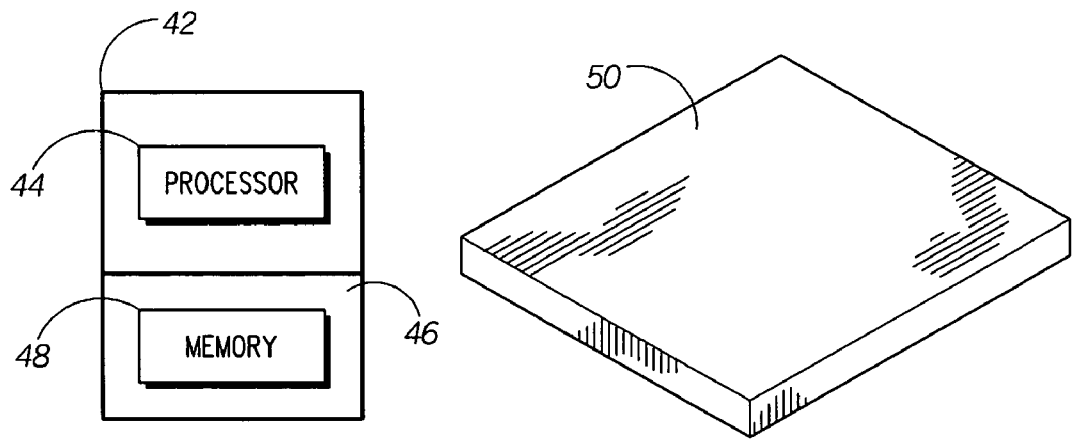
FIG. 4 is a block diagram of a system for estimating a battery state of charge in accordance with an embodiment of the present invention.

Referring to FIG. 4, a system 40 for estimating a battery state of charge can include a memory 48 such as an EPROM for storing at least one among an impedance value, a plurality of values for V drop 0-1 and a plurality of values for V drop 0-1 for a given battery normalized for charge or discharge values providing a stored plurality of values. The memory can be part of a battery or battery pack 46. The system 40 can further include a measuring device measuring at least one among V drop C-0 for the given battery providing a measured V drop C-0 value and V drop 0-1 for the given battery providing a measured V drop 0-1 value as well as a processor 44. The measuring device can be part of an electronic device 42 coupled to the battery or battery pack 46. The processor 44 can be programmed to perform at least one among the functions of dividing the V drop C-0 value by the impedance value to estimate a current that the battery is being charged at or comparing the measured V drop 0-1 value with at least value among stored plurality of values to estimate the battery state of charge. Note, as previously stated above, V drop C-O comprises a difference between a battery voltage when a charger is on and when the charger is turned off and V drop 0-1 comprises the battery voltage delta (V drop) from the moment that the charge current is removed from the battery (0) to some duration of time thereafter (1). Further note that one or more among the memory 48, the measuring device and the processor 44 can reside in at least one among a battery and an electronic device such as a cellular phone, a shaver, a charging device, a two-way radio, a cordless telephone, a cordless toothbrush, a cordless hand tool, and a wireless or cordless charging device. The battery or battery pack 46 on the electronic device 42 can be charged by a charging apparatus 50 such as an inductive charger.

In light of the foregoing description, it should be recognized that embodiments in accordance with the present invention can be realized in hardware, software, or a combination of hardware and software. A network or system according to the present invention can be realized in a centralized fashion in one computer system or processor, or in a distributed fashion where different elements are spread across several interconnected computer systems or processors (such as a microprocessor and a DSP). Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A method of estimating a battery state of charge, comprising the steps of:

measuring a battery voltage when a charger is on;

measuring a battery voltage when the charger is subsequently turned off;

calculating a difference between the battery voltage when the charger is on and when the charger is subsequently turned off;

dividing the difference by an impedance value stored in a memory to estimate a current that the battery is being charged at; and storing a plurality of values that are an ohmic measurement proportional to R1C1 in a battery cell model represented as 2 sets of series RC elements in parallel.

2. The method of claim 1, wherein the method further comprises the step of updating a charge indicator on an electronic device using the current that has been estimated.

3. The method of claim 1, wherein the method further comprises the step of storing the impedance value in a EPROM.

4. The method of claim 1, wherein the method further comprises the step of temperature compensating the plurality of values.

5. The method of claim 2, wherein the step of updating the charge indicator comprises the step of updating a fuel bar.

6. The method of claim 1, wherein the difference in battery voltage is calculated at the moment between when a charge current was being applied and when the charge current is removed from the battery.

7. A method of estimating a battery state of charge in an electronic device, comprising the steps of:

storing at least one among a plurality of values for V drop 0-1 for a given battery and a plurality of values for V drop 0-1 for the given battery normalized for charge or discharge values providing a stored plurality of values;

measuring V drop 0-1 for the given battery providing a measured V drop 0-1 value, wherein measuring V drop 0-1 includes measuring a voltage drop associated with R2C2 and a normalized voltage drop to charge/discharge currents in a battery cell model represented as 2 sets of series RC elements in parallel; and comparing the measured V drop 0-1 value with at least one value among the stored plurality of values to estimate the battery state of charge.

8. The method of claim 7, wherein the method further comprises the step of temperature compensating the stored plurality of values.

9. The method of claim 7, wherein the step of comparing occurs in one among a charge mode and a discharge mode.

10. A system for estimating a battery state of charge, comprising:

a memory for storing at least one among an impedance value, a plurality of values for V drop 0-1 and a plurality of values for V drop 0-1 for a given battery normalized for charge or discharge values providing a stored plurality of values a measuring device measuring at least one among V drop C-0 for the given battery providing a measured V drop C-0 value and V drop 0-1 for the given battery providing a measured V drop 0-1 value, wherein measuring V drop 0-1 includes measuring a voltage drop associated with R2C2 and a normalized voltage drop to charge/discharge currents in a battery cell model represented as 2 sets of series RC elements in parallel; and a processor programmed to perform at least one among the functions of:

dividing the V drop C-0 value by the impedance value to estimate a current that the battery is being charged at; and comparing the measured V drop 0-1 value with at least one value among stored plurality of values to estimate the battery state of charge.

11. The system of claim 10, wherein the memory comprises an EPROM.

12. The system of claim 10, wherein V drop C-0 comprises a difference between a battery voltage when a charger is on and when the charger is turned off.

13. The system of claim 10, wherein V drop 0-1 comprises a battery voltage delta (V drop) from the moment that the charge current is removed from the battery (0) to some duration of time thereafter (1).

14. The system of claim 10, wherein at least one among the memory, the measuring device, and the processor resides within at least one among a battery and an electronic device.

15. The system of claim 14, wherein the electronic device is selected among the group comprising a cellular phone, a shaver, a charging device, a two-way radio, a cordless telephone, a cordless toothbrush, a cordless hand tool.

16. The system of claim 12, wherein the charger is a wireless charger.

17. The system of claim 13, wherein the charger is a wireless charger.

* * * * *